United States Patent
Crotzer et al.

[11] Patent Number: 6,117,539
[45] Date of Patent: *Sep. 12, 2000

[54] CONDUCTIVE ELASTOMER FOR GRAFTING TO AN ELASTIC SUBSTRATE

[75] Inventors: David R. Crotzer, Nashua, N.H.; Arthur G. Michaud, New Bedford, Mass.; Neil N. Silva, Greenville, R.I.

[73] Assignee: Thomas & Betts Inernational, Inc., Sparks, Nev.

[ * ] Notice: This patent is subject to a terminal disclaimer.

[21] Appl. No.: 08/931,438

[22] Filed: Sep. 16, 1997

Related U.S. Application Data

[63] Continuation-in-part of application No. 08/736,830, Oct. 28, 1996, Pat. No. 5,949,029.
[51] Int. Cl.[7] .................................................. B32B 5/22
[52] U.S. Cl. ............................ 428/317.9; 428/308.4; 428/316.6; 428/319.1; 428/320.2; 521/92; 521/123
[58] Field of Search .......................... 428/320.2, 308.4, 428/316.6, 319.1, 317.9; 521/92, 123

[56] References Cited

U.S. PATENT DOCUMENTS

| | | | |
|---|---|---|---|
| 3,971,610 | 7/1976 | Buchoff et al. | 339/17 |
| 4,145,317 | 3/1979 | Sado et al. | 252/512 |
| 4,231,901 | 11/1980 | Berbeco | 252/511 |
| 4,301,040 | 11/1981 | Berbeco | 252/511 |
| 4,731,282 | 3/1988 | Tsukagoshi et al. | 428/220 |
| 4,853,277 | 8/1989 | Chant | 428/209 |
| 5,306,558 | 4/1994 | Takahashi et al. | 428/331 |
| 5,431,571 | 7/1995 | Hanrahan et al. | 439/91 |

*Primary Examiner*—Cathy F. Lam
*Attorney, Agent, or Firm*—Weingarten, Schurgin, Gagnebin & Hayes LLP

[57] ABSTRACT

An electrically conductive elastomer for grafting to an elastic substrate is disclosed. The conductive elastomer comprises a non-conductive elastic material having a quantity of conductive flakes interspersed therein. The conductive elastomer may further comprise a quantity of conductive particles interspersed in the non-conductive elastic material. Alternatively, a quantity of conductive particles may be imbedded in an outer surface of the conductive elastomer. The conductive elastomer is typically grafted to an elastic substrate by a thermal process.

22 Claims, 5 Drawing Sheets

CONDUCTIVE ELASTOMER FOR GRAFTING TO AN ELASTIC SUBSTRATE

CROSS-REFERENCE TO RELATED APPLICATIONS

This patent application is a continuation-in-part application of U.S. patent application Ser. No. 08/736,830 filed Oct. 28, 1996; now U.S. Pat. No. 5,949,029.

STATEMENT REGARDING FEDERALLY SPONSORED RESEARCH OR DEVELOPMENT

N/A

FIELD OF INVENTION

The present invention relates generally to electrically conductive devices and, more particularly, to an electrically conductive elastomer for grafting to an elastic substrate.

BACKGROUND OF THE INVENTION

The electronics industry has evolved to the point where electronic circuitry is present in a large number of new products. Many of these new products are used in environments where elastic properties are required, for example, to have a product fit into a confined or hard to reach area. Also, it is sometimes desirable to have electronic circuitry attached to a material having elastic properties.

Heretofore, such elasticity in electronic circuitry was not available due to a lack of any electrical interconnect components having elastic properties. That is, the electrical resistance of most electrically conductivity materials changes greatly when these materials are deformed in some manner, thereby precluding these materials from being used as reliable elastic conductors. Accordingly, it would be desirable to provide an electrically conductive material having elastic properties. More particularly, it would be desirable to provide an electrically conductive elastomer for grafting to an elastic substrate.

SUMMARY OF THE INVENTION

The present invention contemplates an electrically conductive elastomer for grafting to an elastic substrate. The conductive elastomer comprises a non-conductive elastic material having a quantity of conductive flakes interspersed therein. The conductive elastomer may further comprise a quantity of conductive particles interspersed in the non-conductive elastic material. Alternatively, a quantity of conductive particles may be imbedded in an outer surface of the conductive elastomer. The conductive elastomer is typically grafted to an elastic substrate by a thermal process.

In one application, the conductive elastomer is grafted to an elastic substrate to form electrically conductive circuit traces. In another application, the conductive elastomer is grafted to an elastic substrate which is used as a telephone, computer, or calculator keypad. In still another application, the conductive elastomer is grafted to an elastic substrate to form a shield against unwanted electric and magnetic fields.

In view of the foregoing, it is readily apparent that the primary object of the present invention is to provide an electrically conductive elastomer for grafting to an elastic substrate.

The above-stated primary object, as well as other objects, features, and advantages, of the present invention will become more readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Figure 1:
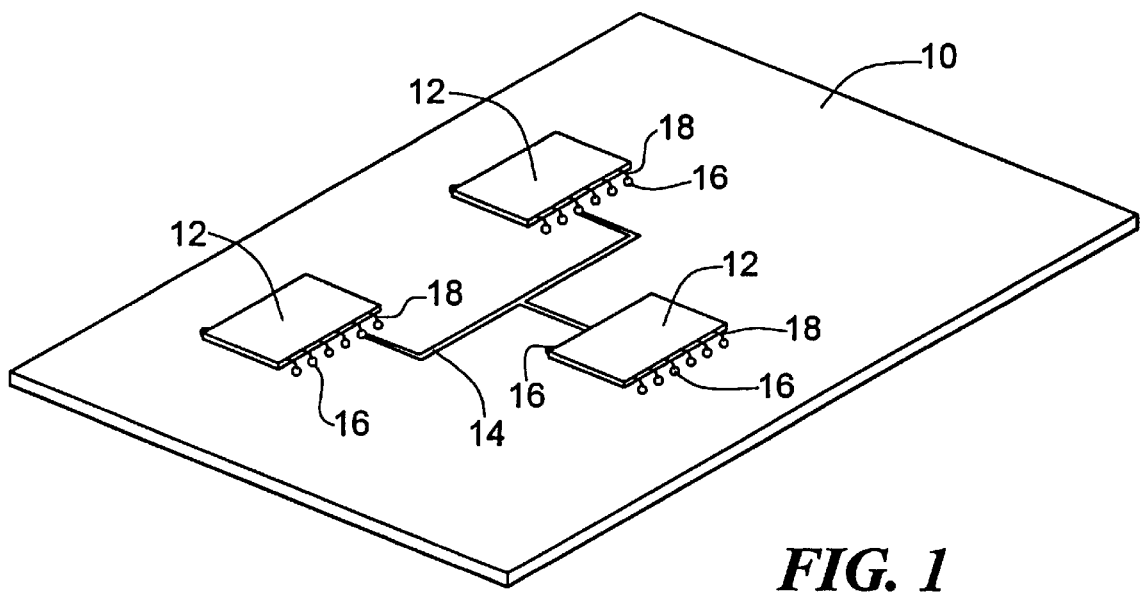
FIG. 1 is a perspective view of an elastic substrate having several integrated circuit components electrically interconnected with electrically conductive traces formed with an electrically conductive elastomer material in accordance with the present invention.

Referring to FIG. 1, there is shown a perspective view of an elastic substrate 10 having several integrated circuit components 12 mounted thereon. The integrated circuit components 12 are electrically interconnected with electrically conductive traces 14 (only one shown for illustrative purposes). The electrically conductive traces 14 are formed of an electrically conductive elastomer material which is grafted directly to the elastic substrate 10.

The elastic substrate 10 may be fabricated of one of many elastic materials such as, for example, silicone rubber or flourosilicone rubber. The elastic substrate 10 has electrically conductive through-holes 16 formed therein. The integrated circuit components 12 have electrically conductive leads 18 extending therefrom. The integrated circuit components 12 are mounted to the elastic substrate 10 by mating the electrically conductive leads 18 with the electrically conductive through-holes 16 and soldering the same together by many known conventional methods. The electrically conductive elastomer material is grafted directly to the elastic substrate 10 so as to form the electrically conductive traces 14, which extend between the electrically conductive through-holes 16 thereby making electrical connections between the integrated circuit components 12. It should be noted that in an alternative embodiment, the electrically conductive elastomer material may extend between contact areas other than through-holes, such as for example surface mount pads or circuit board edge contacts.

Figure 2:
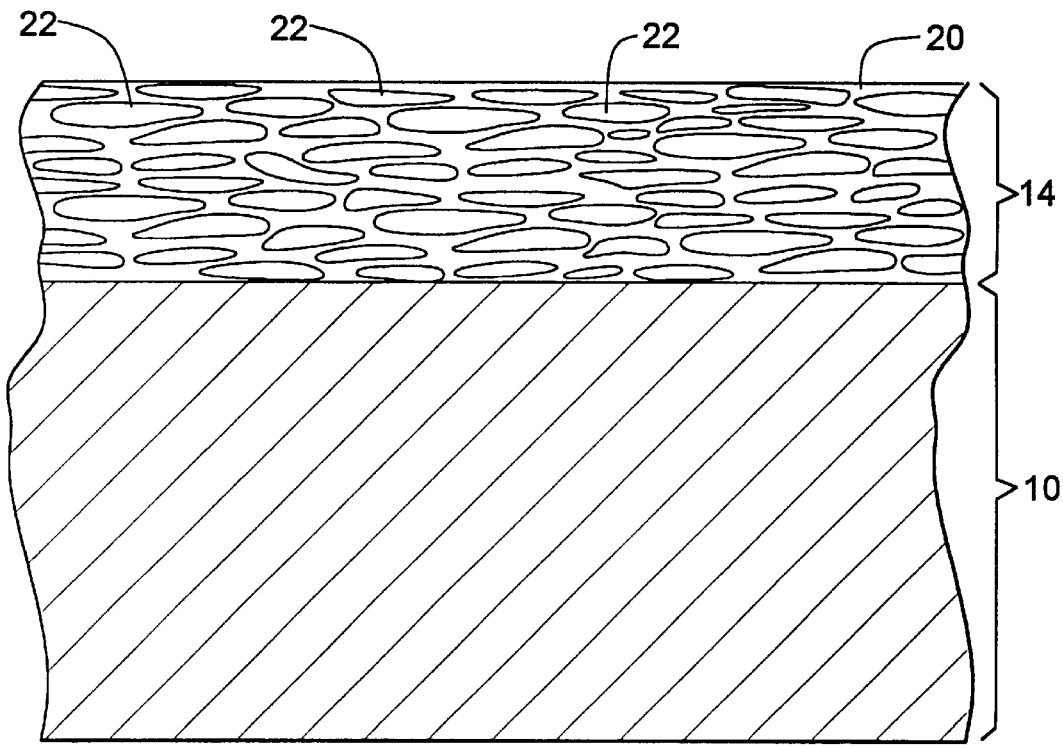
FIG. 2 is a cross-sectional view of the elastic substrate shown in FIG. 1 having the electrically conductive elastomer material grafted thereto in accordance with the present invention.

Referring to FIG. 2, there is shown a cross-sectional view of the elastic substrate 10 with the electrically conductive elastomer material 14 grafted thereto. The electrically conductive elastomer material 14 comprises a mixture of an elastic material 20 and a quantity of electrically conductive flakes 22. The elastic material 20 may be fabricated of one of many elastic materials such as, for example, silicone rubber or fluorosilicone rubber. The conductive flakes 22 may be fabricated of many different types of conductive or semiconductive materials such as, for example, silver, nickel, or carbon. Alternatively, the conductive flakes 22 may be fabricated of many different types of conductive, semiconductive, or insulative materials which are coated with or have interspersed therein other conductive or semiconductive materials such as, for example, silver, nickel, or carbon. The size of the conductive flakes 22 may vary depending on the level of conductivity that is required and the size of the electrically conductive traces 14.

The electrically conductive elastomer material 14 is grafted to the elastic substrate 10 by a thermal grafting process which typically begins by providing the elastic substrate 10 in a fully cured state. The electrically conductive elastomer material 14 is deposited on the elastic substrate 10 in an uncured state by spray coating, roller coating, transfer pad printing, or any of a variety of other known methods. The elastic substrate 10 and the electrically conductive elastomer material 14 are then subjected to a thermal cycle whereby the electrically conductive elastomer material 14 is fully cured and grafted to the elastic substrate 10. During this thermal grafting process, polymer chains in the electrically conductive elastomer material 14 are grafted to polymer chains in the elastic substrate 10 so as to form a strong chemical bond. In the uncured state, the elastic material 20 and the conductive flakes 22 are typically suspended in a solvent, for example, TOLUENE™, which evaporates during the thermal cycle. It should be noted that the grafting process may alternatively involve irradiation or compressive bonding to fully cure and graft the electrically conductive elastomer material 14 to the elastic substrate 10.

The conductive flakes 22 which are interspersed within the elastic material 20 of the electrically conductive elastomer material 14 provide low resistivity even when the electrically conductive elastomer material 14 is being deformed through expansion or compression since the surface area of the conductive flakes 22 is large enough for electrical contact to be made between adjacent conductive flakes 22 when such deformities occur. For instance, during lengthwise expansion of the electrically conductive elastomer material 14, the length of the electrically conductive elastomer material 14 is increased while the thickness of the electrically conductive elastomer material 14 is decreased. The decrease in thickness brings adjacent conductive flakes 22 closer together, thereby increasing the likelihood that the large surface areas of adjacent conductive flakes 22 will come into physical, and hence electrical, contact with each other. The increase in length results in lateral movement of the conductive flakes 22, thereby causing the large surface areas of adjacent conductive flakes 22 to rub or scrape against each other so that physical, and hence electrical, contact between adjacent conductive flakes 22 is maintained.

Figure 3:
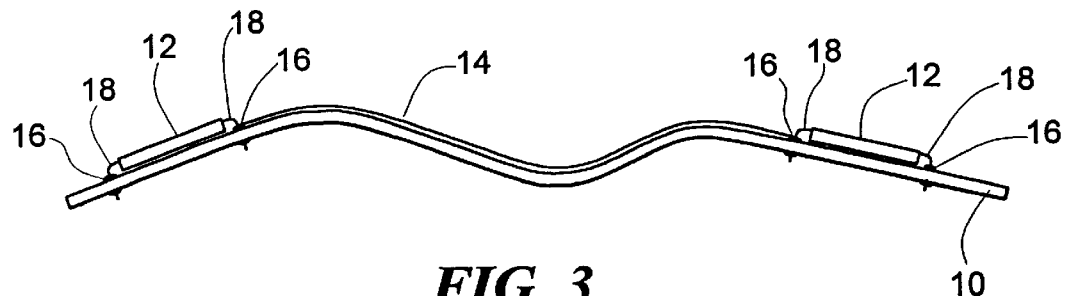
FIG. 3 is an edge view of the elastic substrate shown in FIG. 1 in a deformed state for purposes of demonstrating that the electrically conductive elastomer material may still perform its intended function while being deformed.

Referring to FIG. 3, there is shown an edge view of the elastic substrate 10 with the integrated circuit components 12 mounted thereon and the electrically conductive elastomer material 14 grafted thereto. The elastic substrate 10 and the electrically conductive elastomer material 14 are both shown in a deformed state for purposes of demonstrating that the electrically conductive elastomer material 14 will still perform its intended function while being deformed. That is, despite the fact that the electrically conductive elastomer material 14 is deformed, the electrically conductive elastomer material 14 still maintains electrical connections between the integrated circuit components 12.

The durometer rating of the elastic material 20 in the electrically conductive elastomer material 14 typically ranges between 40 and 80 on the Shore A scale. Such a durometer rating allows the electrically conductive elastomer material 14 to be expanded or compressed to at least 33% of its at-rest shape. When such a deformation occurs, the conductive flakes 22 interspersed within the elastic material 20 of the electrically conductive elastomer material 14 interact as described above so as to maintain a low resistivity throughout the electrically conductive elastomer material 14. An electrically conductive elastomer material that has been grafted to an elastic substrate in accordance with the present invention has been shown to maintain a resistance in the range of 20–30 mohms during measurements performed while deforming the electrically conductive elastomer material within the above-described limits.

At this point it should be noted that although the elastic substrate 10 has been shown above with leaded integrated circuit components 12 mounted thereto, it also possible to utilize the present invention in an environment where discrete components or surface mount components are used. Furthermore, although only a single layered elastic substrate 10 has been shown above, it is also possible to utilize the present invention on multilayer elastic substrates or printed circuit boards.

One particular application wherein the above-described electrically conductive elastomer material would be useful is a telephone, calculator, or computer keypad wherein an electrical connection must be made by pressing a key on the keypad. Such a keypad is constructed with an elastic material such as, for example, silicone rubber or fluorosilicone rubber, and an electrically conductive elastomer material is grafted onto a surface of that elastic material according to the above-described process. Thus, when a key of the keypad is pressed against a mating electrically conductive surface, such as an electrically conductive contact area on a printed circuit board, an electrical connection is made between the electrically conductive elastomer material and the electrically conductive contact.

Figure 4:
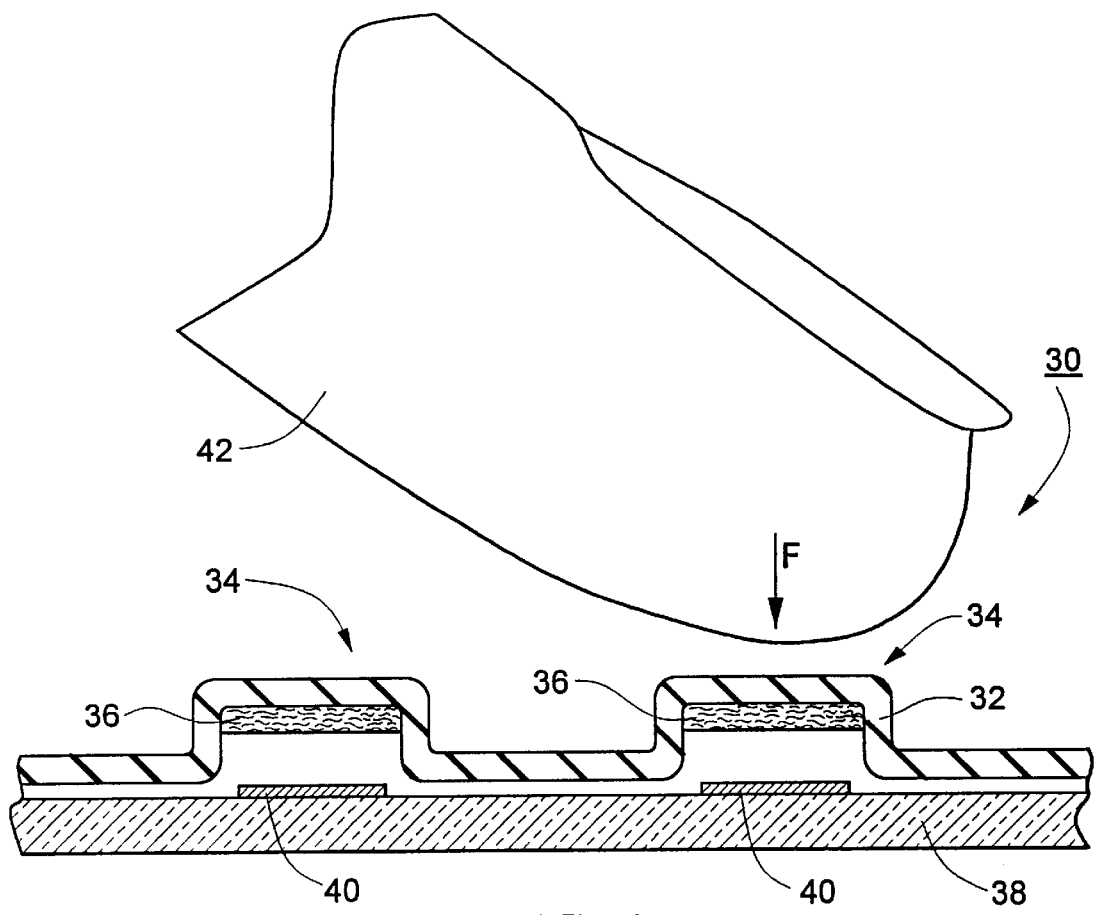
FIG. 4 is a cross-sectional view of a keypad comprising an elastic cover and having an electrically conductive elastomer material grafted to the elastic cover in accordance with the present invention.

Referring to FIG. 4, there is shown a cross-sectional view of a telephone, calculator, or computer keypad 30 comprising an elastic cover 32 having keys 34 formed therein. On the underside of the cover 32, beneath each of the keys 34, an electrically conductive elastomer material 36 is grafted to the elastic cover 32.

A printed circuit board 38 is positioned beneath the cover 32, and electrically conductive traces 40 are formed on the printed circuit board 38 beneath the keys 34. Thus, when a force F is applied to one of the keys 34 of the elastic cover 32 from, for example, a human finger 42, the electrically conductive elastomer material 36 will come into electrical contact with a corresponding one of the electrically conductive traces 40.

Another particular application wherein the above-described electrically conductive elastomer material would be useful is a shield for electromagnetic interference (EMI) or other such purposes. Such a shield is constructed with an elastic material such as, for example, silicone rubber or flourosilicone rubber, and an electrically conductive elastomer material is grafted onto a surface of that elastic material according to the above-described process. The electrically conductive elastomer material provides an electrically conductive shield for preventing the propagation of unwanted electric and magnetic fields for EMI or other purposes.

Figure 5:
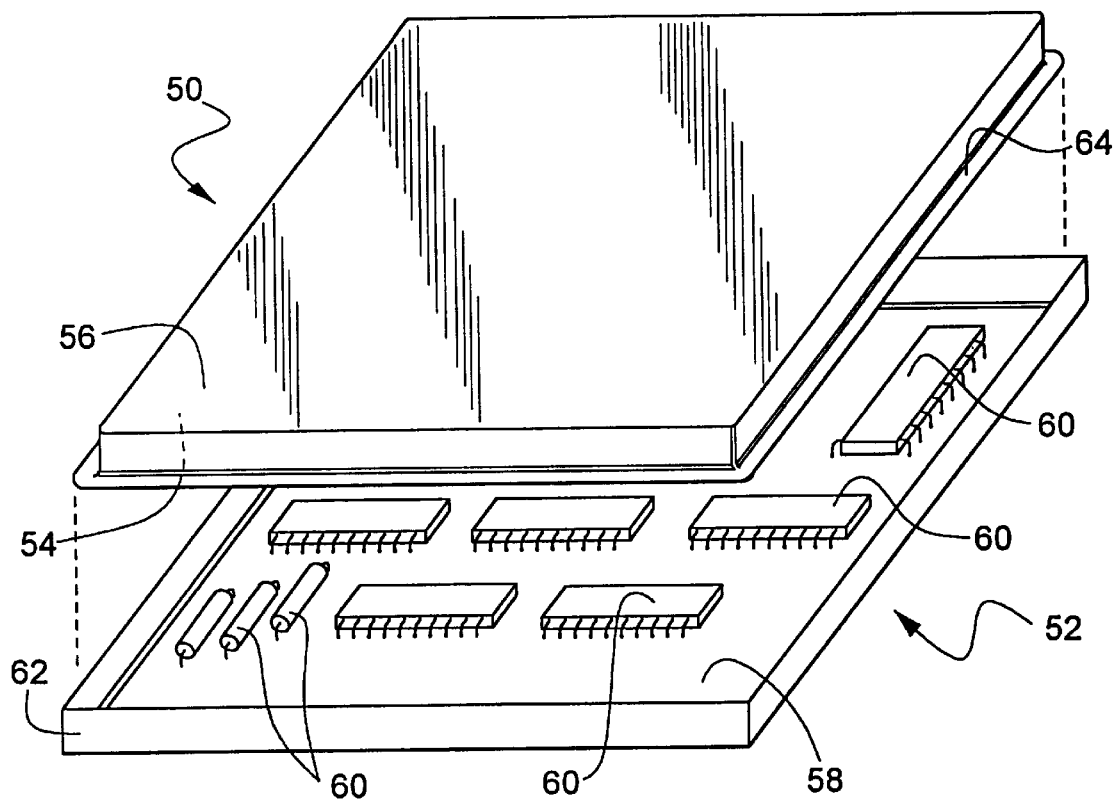
FIG. 5 is a perspective view of an elastic EMI shield having an elastic substrate and an electrically conductive elastomer material grafted to a surface of the elastic substrate in accordance with the present invention.

Referring to FIG. 5, there is shown a perspective view of an elastic EMI shield 50 for shielding unwanted electric and magnetic fields from a mating circuit board assembly 52. The elastic EMI shield 50 is fabricated with an elastic material such as, for example, silicone rubber or flourosilicone rubber, which is shaped according to the particular application. The elastic material is then coated with an electrically conductive elastomer material. The electrically conductive elastomer material may be grafted onto either an inner 54 or an outer 56 surface of the elastic material according to the above-described process. The electrically conductive elastomer material may also be grafted onto both the inner 54 and the outer 56 surfaces.

The mating circuit board assembly 52 comprises a electronic circuit board 58 having a plurality of electronic components 60 mounted thereon. The circuit board 58 is mounted in a case 62 such as, for example, a cellular telephone case. The elastic EMI shield 50 is shaped so as to cover and enclose the electronic components 60 on the circuit board 58. The elastic EMI shield 50 may be secured to either the circuit board 58 or the case 62 by many methods including soldering, adhesives, or applied pressure, as described below.

Figure 6:
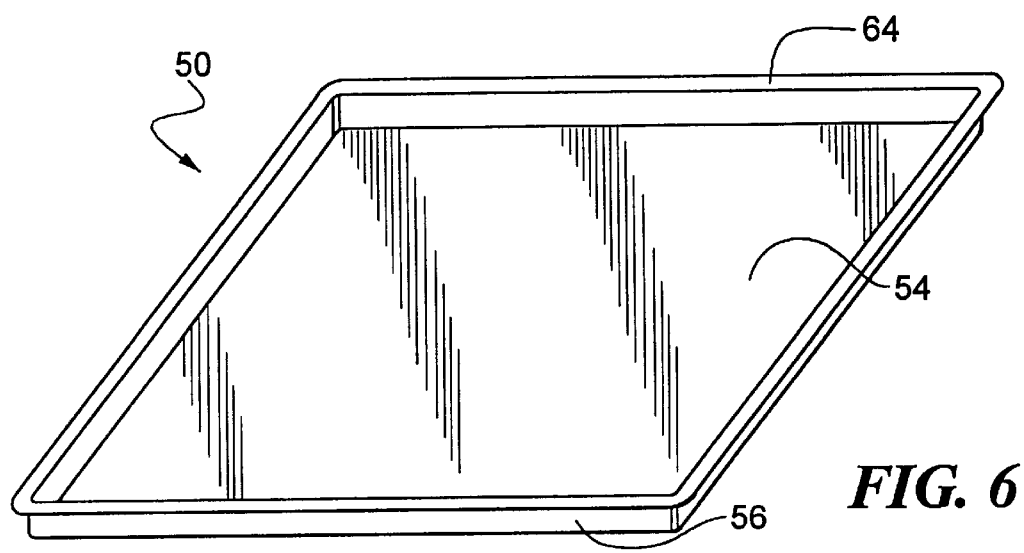
FIG. 6 is a perspective view of the underside of the elastic EMI shield shown in FIG. 5.

Referring to FIG. 6, there is shown a perspective view of the underside of the elastic EMI shield 50. Along the entire edge of the elastic EMI shield 50 is a lip 64. When the electrically conductive elastomer material is grafted onto the inner surface 54 of the elastic EMI shield 50, an additional electrically conductive material may be applied to the inner surface 54 in the area of the lip 64. As described in detail below, this additional electrically conductive material may take the form of electrically conductive piercing or indenting particles. These particles serve to insure that an electrical connection is made between the electrically conductive elastomer material and either the circuit board 58 or the case 62 when the elastic EMI shield 50 is mated therewith.

Figure 7:
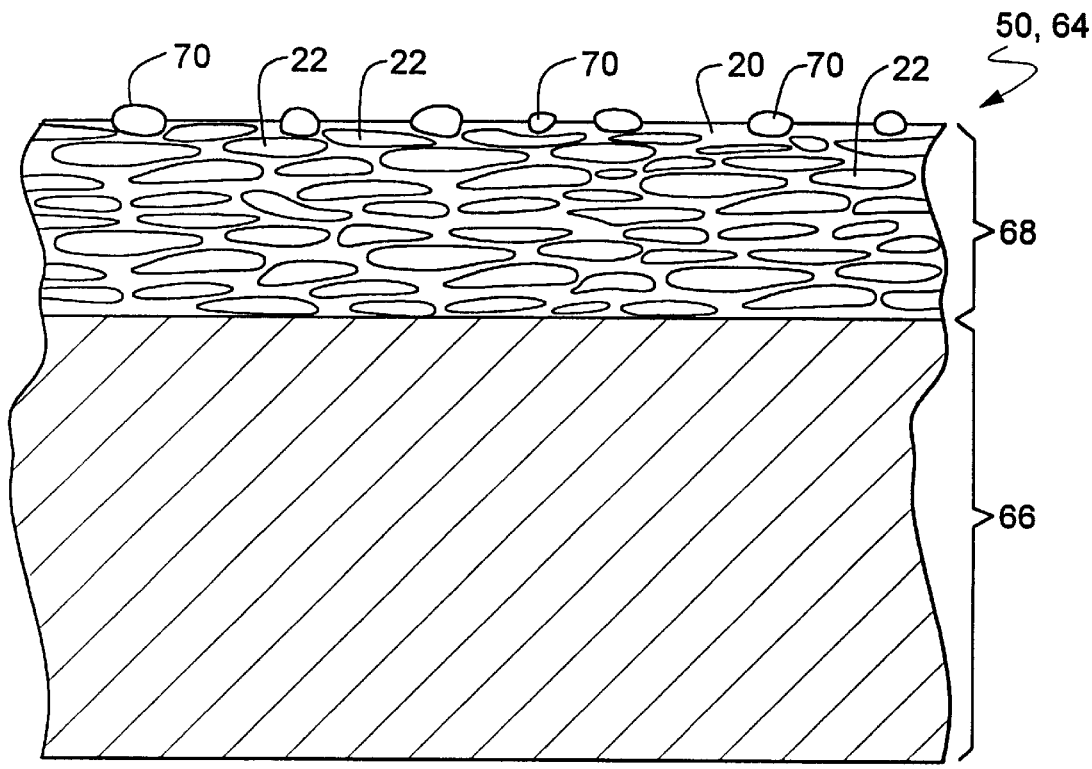
FIG. 7 is a cross-sectional view of a section of the elastic EMI shield shown in FIG. 5 in one embodiment.

Referring to FIG. 7, there is shown a cross-sectional view of the elastic EMI shield 50 in the area of the lip 64. The elastic EMI shield 50 comprises an elastic substrate 66 with an electrically conductive elastomer material 68 grafted thereto. The elastic substrate 66 may be fabricated of one of many elastic materials such as, for example, silicone rubber or fluorosilicone rubber. Similar to the electrically conductive elastomer material 14 described in FIG. 2, the electrically conductive elastomer material 68 comprises a mixture of an elastic material 20 and a quantity of electrically conductive flakes 22. The electrically conductive elastomer material 68 also comprises a quantity of electrically conductive indenting particles 70 that are imbedded into the surface of the electrically conductive elastomer material 68. The conductive indenting particles 70 are preferably applied to the surface of the electrically conductive elastomer material 68 prior to a thermal cycle so that the particles 70 are secured to the electrically conductive elastomer material 68 when it fully cures. The indenting nature of the conductive indenting particles 70 provides a means by which an insulating oxide which may have formed on an electrically conductive surface which is to come into contact with the lip 64 of the elastic EMI shield 50 (i.e., the circuit board 58 or the case 62) may be pushed aside so that an improved electrical connection may be formed between that electrically conductive surface and the electrically conductive elastomer material 68 of the elastic EMI shield 50. It should be noted that the conductive indenting particles 70 may push aside other contaminants such as fibers and particulates which may be present on a mating conductive surface.

The conductive indenting particles 70 may be fabricated of many different types of conductive or semiconductive materials such as, for example, silver, nickel, or carbon. Alternatively, the conductive indenting particles 70 may be fabricated of many different types of conductive, semiconductive, or insulative materials which are coated with or have interspersed therein other conductive or semiconductive materials such as, for example, silver, nickel, or carbon. The conductive indenting particles 70 typically have a 50 μm average particle size.

Figure 8:
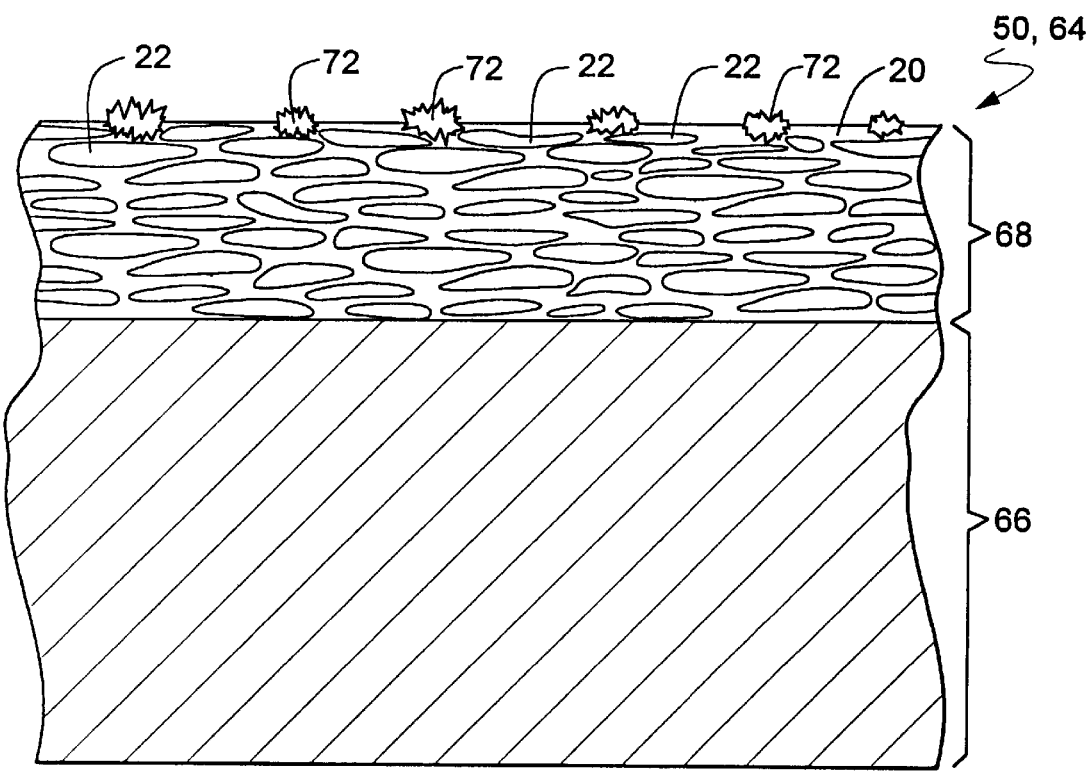
FIG. 8 is a cross-sectional view of a section of the elastic EMI shield shown in FIG. 5 in another embodiment.

Referring to FIG. 8, there is shown a cross-sectional view of another embodiment of the elastic EMI shield 50 in the area of the lip 64. In this particular embodiment, the electrically conductive elastomer material 68 has a quantity of electrically conductive piercing particles 72 that are imbedded into the surface of the electrically conductive elastomer material 68. The conductive piercing particles 72 are preferably applied to the surface of the electrically conductive elastomer material 68 prior to a thermal cycle so that the particles 72 are secured to the electrically conductive elastomer material 68 when it fully cures. The piercing nature of the conductive piercing particles 72 provides a means by which an insulating oxide which may have formed on an electrically conductive surface which is to come into contact with the lip 64 of the elastic EMI shield 50 (i.e., the circuit board 58 or the case 62) may be pierced so that an improved electrical connection may be formed between that electrically conductive surface and the electrically conductive elastomer material 68 of the elastic EMI shield 50. It should be noted that the conductive piercing particles 72 may pierce through other contaminants such as fibers and particulates which may be present on a mating conductive surface.

Similar to the conductive indenting particles 70, the conductive piercing particles 72 may be fabricated of many different types of conductive or semiconductive materials such as, for example, silver, nickel, or carbon. Alternatively, the conductive piercing particles 72 may be fabricated of many different types of conductive, semiconductive, or insulative materials which are coated with or have interspersed therein other conductive or semiconductive materials such as, for example, silver, nickel, or carbon. The conductive piercing particles 72 typically have a 40 μm average particle size.

Figure 9:
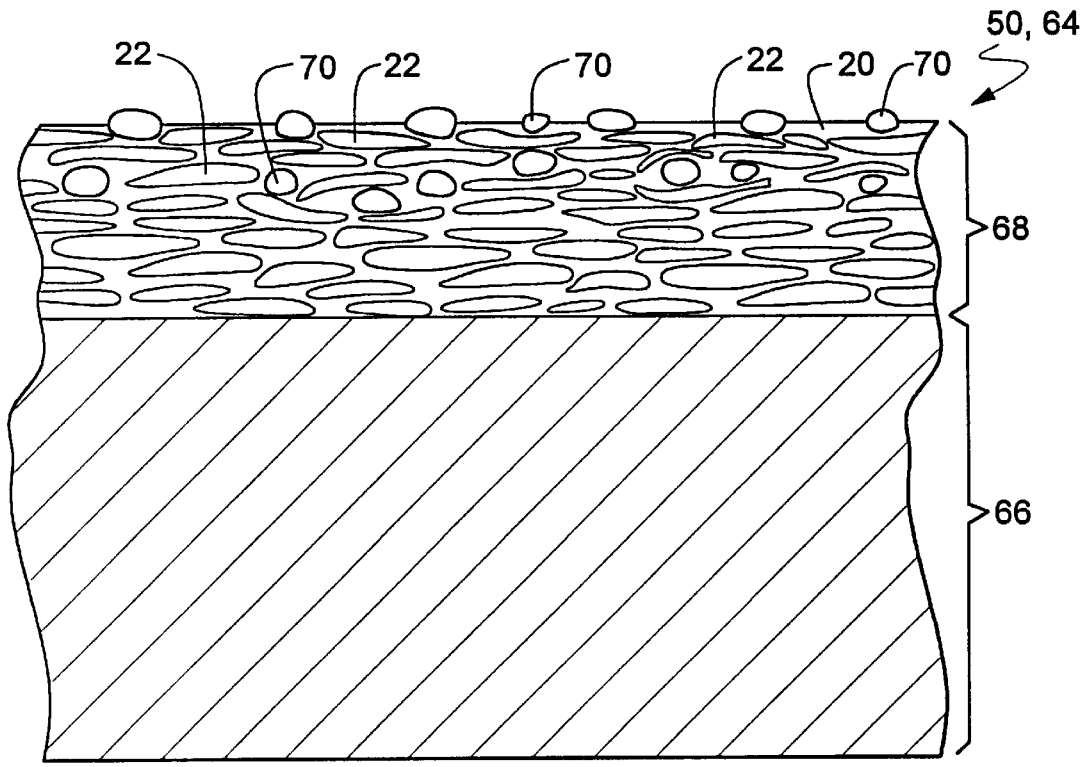
FIG. 9 is a cross-sectional view of a section of the elastic EMI shield shown in FIG. 5 in still another embodiment.

Referring to FIG. 9, there is shown a cross-sectional view of another embodiment of the elastic EMI shield 50 in the area of the lip 64. In this particular embodiment, the electrically conductive elastomer material 68 comprises a mixture of an elastic material 20, a quantity of electrically conductive flakes 22, and a quantity of the electrically conductive indenting particles 70. That is, the conductive indenting particles 70 are deposited on the elastic substrate 66 along with the elastic material 20 and the conductive flakes 22. The distribution of the conductive indenting particles 70 in the electrically conductive elastomer material 68 is shown to be near the surface of the electrically conductive elastomer material 68 since the conductive indenting particles 70 are more likely than the conductive flakes 22 to bounce off the elastic substrate 66 during the application of the electrically conductive elastomer material 68. That is, when the electrically conductive elastomer material 68 is applied to the elastic substrate 66 by spray coating, the conductive indenting particles 70 are more likely to bounce off the elastic substrate 66 than the conductive flakes 22. Of course, this location for the conductive indenting particles 70 is preferable based on their functionality (e.g., to push aside oxide on a mating conductive surface). The amount of the conductive indenting particles 70 in the electrically conductive elastomer material 68 need typically only be 5% nominal by weight in order to insure their proper functionality.

Figure 10:
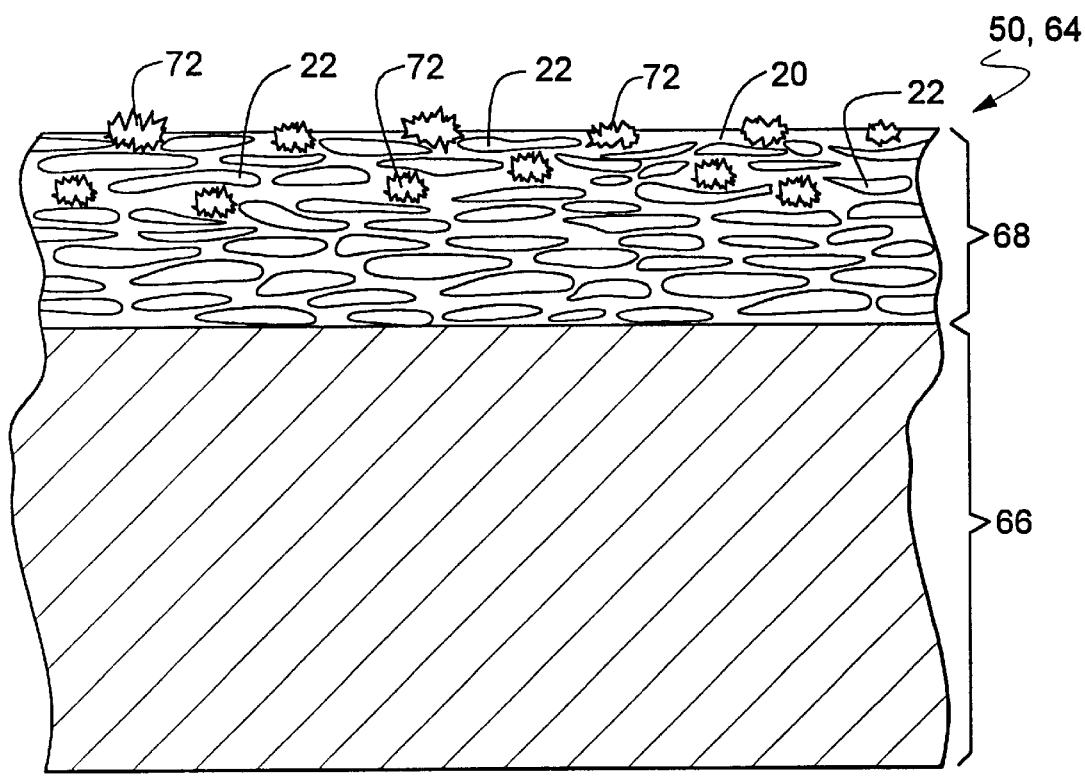
FIG. 10 is a cross-sectional view of a section of the elastic EMI shield shown in FIG. 5 in a further embodiment.

Referring to FIG. 10, there is shown a cross-sectional view of another embodiment of the elastic EMI shield 50 in the area of the lip 64. In this particular embodiment, the electrically conductive elastomer material 68 comprises a mixture of an elastic material 20, a quantity of electrically conductive flakes 22, and a quantity of the electrically conductive piercing particles 72. That is, the conductive piercing particles 72 are deposited on the elastic substrate 66 along with the elastic material 20 and the conductive flakes 22. The distribution of the conductive piercing particles 72 in the electrically conductive elastomer material 68 is shown to be near the surface of the electrically conductive elastomer material 68 since the conductive piercing particles 72 are more likely than the conductive flakes 22 to bounce off the elastic substrate 66 during the application of the electrically conductive elastomer material 68. That is, when the electrically conductive elastomer material 68 is applied to the elastic substrate 66 by spray coating, the conductive piercing particles 72 are more likely to bounce off the elastic substrate 66 than the conductive flakes 22. Of course, this location for the conductive piercing particles 72 is preferable based on their functionality (e.g., to pierce through oxide on a mating conductive surface). The amount of the conductive piercing particles 72 in the electrically conductive elastomer material 68 need typically only be 5% nominal by weight in order to insure their proper functionality.

At this point it should be noted that any of the above-described electrically conductive elastomer materials, including those with electrically conductive piercing and indenting particles, may be utilized for any number of applications wherein an electrically conductive surface, trace, coating, or other electrically conductive element having elastic properties is required. For example, an electrically conductive elastomer material may be grafted to an elastic substrate for purposes of forming a conductive plane for shielding or grounding purposes or the like. The density and grouping of the conductive flakes in the above-described electrically conductive elastomer materials are such that extremely effective shielding or grounding layers may be provided.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. An elastic circuit comprising:
   a substrate having an outer surface, said substrate being formed of a non-conductive elastic material; and
   a conductive elastomer thermally grafted directly to at least a portion of said outer surface of said substrate, said conductive elastomer being formed of a non-conductive elastic material having a quantity of conductive flakes interspersed in said elastomer to provide continuous electrical communication through contact between adjacent flakes throughout deformation of the said elastomer.

2. The elastic circuit as defined in claim 1, wherein the grafting of said conductive elastomer to said substrate is performed by irradiation.

3. The elastic circuit as defined in claim 1, wherein the grafting of said conductive elastomer to said substrate is performed by compression.

4. The elastic circuit as defined in claim 1, wherein said conductive flakes are formed of a solid conductive material.

5. The elastic circuit as defined in claim 1, wherein said conductive flakes are formed of a semi-conductive material that is coated with a conductive material.

6. The elastic circuit as defined in claim 1, wherein said conductive flakes are formed of a non-conductive material that is coated with a conductive material.

7. The elastic circuit as defined in claim 1, wherein said conductive elastomer has an outer surface, and wherein conductive particles interspersed in said non-conductive elastic material such that at least a portion of some of said conductive particles extend beyond said outer surface of said conductive elastomer.

8. The elastic circuit as defined in claim 7, wherein said conductive particles have a rounded outer surface so as to push aside any oxide or other contaminants which may have formed on a mating conductive surface when said elastic circuit is coupled to the mating conductive surface.

9. The elastic circuit as defined in claim 8, wherein said rounded conductive particles have a 50 $\mu$m average particle size.

10. The elastic circuit as defined in claim 7, wherein said conductive particles have a jagged outer surface so as to pierce through any oxide or other contaminants which may have formed on a mating conductive surface when said elastic circuit is coupled to the mating conductive surface.

11. The elastic circuit as defined in claim 10, wherein said jagged conductive particles have a 40 $\mu$m average particle size.

12. The elastic circuit as defined in claim 7, wherein said conductive particles are formed of a solid conductive material.

13. The elastic circuit as defined in claim 7, wherein said conductive particles are formed of a semi-conductive material that is coated with a conductive material.

14. The elastic circuit as defined in claim 7, wherein said conductive particles are formed of a non-conductive material that is coated with a conductive material.

15. The elastic circuit as defined in claim 1, wherein said conductive elastomer has an outer surface, and wherein conductive particles are imbedded in and extend beyond said outer surface of said conductive elastomer.

16. The elastic circuit as defined in claim 15, wherein said conductive particles have a rounded outer surface so as to push aside any oxide or other contaminants which may have formed on a mating conductive surface when said elastic circuit is coupled to the mating conductive surface.

17. The elastic circuit as defined in claim 16, wherein said rounded conductive particles have a 50 $\mu$m average particle size.

18. The elastic circuit as defined in claim 15, wherein said conductive particles have a jagged outer surface so as to pierce through any oxide or other contaminants which may have formed on a mating conductive surface when said elastic circuit is coupled to the mating conductive surface.

19. The elastic circuit as defined in claim 18, wherein said jagged conductive particles typically have a 40 $\mu$m average particle size.

20. The elastic circuit as defined in claim 15, wherein said conductive particles are formed of a solid conductive material.

21. The elastic circuit as defined in claim 15, wherein said conductive particles are formed of a semi-conductive material that is coated with a conductive material.

22. The elastic circuit as defined in claim 15, wherein said conductive particles are formed of a non-conductive material that is coated with a conductive material.

* * * * *

UNITED STATES PATENT AND TRADEMARK OFFICE
CERTIFICATE OF CORRECTION

PATENT NO. : 6,117,539  
DATED : September 12, 2000  
INVENTOR(S) : David R. Crotzer, et al.

Page 1 of 1

It is certified that error appears in the above-identified patent and that said Letters Patent is hereby corrected as shown below:

<u>Title page,</u>
Item [75], Inventors: "Neil", should read -- Neill --.

Signed and Sealed this

Thirtieth Day of October, 2001

*Attest:*

*Attesting Officer*

NICHOLAS P. GODICI
*Acting Director of the United States Patent and Trademark Office*